United States Patent
Eun

(10) Patent No.: US 7,615,858 B2
(45) Date of Patent: Nov. 10, 2009

(54) STACKED-TYPE SEMICONDUCTOR DEVICE PACKAGE

(75) Inventor: Hyung-Lae Eun, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 11/961,747

(22) Filed: Dec. 20, 2007

(65) Prior Publication Data

US 2008/0150117 A1    Jun. 26, 2008

(30) Foreign Application Priority Data

Dec. 20, 2006   (KR) ...................... 10-2006-0131082

(51) Int. Cl.
*H01L 23/48* (2006.01)

(52) U.S. Cl. ................. 257/686; 257/E23.01
(58) Field of Classification Search .................. 257/686; 438/107
See application file for complete search history.

(56) References Cited

U.S. PATENT DOCUMENTS 5,466,634 A    11/1995   Beilstein, Jr. et al.
6,884,654 B2    4/2005   King et al.

FOREIGN PATENT DOCUMENTS

| JP | 2003-017617 | | 1/2003 |
|---|---|---|---|
| JP | 2003017617 A | * | 1/2003 |
| JP | 2006-216692 | | 8/2006 |
| JP | 2006-278975 | | 10/2006 |
| KR | 2005-0048123 | | 5/2005 |

OTHER PUBLICATIONS

English language abstract of Japanese Publication No. 2003-017617.

* cited by examiner

*Primary Examiner*—N Drew Richards
*Assistant Examiner*—Mamadou Diallo
(74) *Attorney, Agent, or Firm*—Marger Johnson & McCollom, P.C.

(57) ABSTRACT

A stacked-type semiconductor device package is provided. The stacked-type semiconductor device package includes a plurality of stacked semiconductor chip packages with joining electrodes exposed on sides of the semiconductor chip packages and a flexible printed circuit board (flexible PCB) on which the stacked semiconductor chip packages are mounted. The flexible PCB includes a first surface having connecting electrodes corresponding to the joining electrodes of the stacked semiconductor chip packages and a second surface opposite the first surface. The flexible PCB covers the sides of the stacked semiconductor chip packages, and the connecting electrodes of the first surface are connected to the joining electrodes of the stacked semiconductor chip packages.

19 Claims, 5 Drawing Sheets

STACKED-TYPE SEMICONDUCTOR DEVICE PACKAGE

CROSS-REFERENCE TO RELATED APPLICATIONS

This U.S. non-provisional patent application claims priority under 35 U.S.C. §119 to Korean Patent Application No. 10-2006-131082 filed on Dec. 20, 2006, the entire contents of which are hereby incorporated by reference.

BACKGROUND

1. Technical Field

The present invention relates to semiconductor device packages and, more particularly, to a stacked-type semiconductor device package.

2. Description of the Related Art

In the semiconductor industry, packaging technologies for integrated circuits (ICs) have been advancing to meet requirements for miniaturization and mounting reliability. For example, the requirement for miniaturization results in acceleration of technological development for a package having a similar size in relation to a semiconductor chip. Further, the requirement for mounting reliability places importance on packaging technologies that are capable of enhancing efficiency of a mounting process and improving mechanical and electrical reliability after the mounting process is completed.

Including requirements for multi-functionalization as well as miniaturization of electric and electronic appliances, various technologies have been studied and developed to provide high-capacity semiconductor products. Methods for providing the high-capacity semiconductor products include increasing the capacity of a memory chip, i.e., increased integration of the memory chip. The increased integration of the memory chip may be achieved by integrating more cells into a limited space of the semiconductor chip.

However, the increased integration of the memory chip requires high-level technology such as precise ultra-small linewidth processes as well as significant development time. Accordingly, stacking technologies have been proposed as alternative methods for providing high-capacity semiconductor products.

In recent years, demands for system-in-package (SIP) and multi-chip package (MCP) technologies have been rapidly increasing for applications in mobile appliances. The SIP is a special form of the MCP where different semiconductor devices (e.g., DRAM, SRAM, CPU, etc.) are integrated into one package. In the SIP and the MCP, even when only one semiconductor device is defective, the package is treated as a bad package although the other semiconductor devices in the package are not defective. Therefore, it is difficult to improve production yield of these types of packages.

In order to overcome these problems, a package on package (POP) or a package in package (PIP) technology has been used. In the POP and PIP technologies, after semiconductor chips are assembled into a semiconductor chip package, good semiconductor chip packages are selected by means of a test process so that they can be manufactured into one package. However, a conventional POP needs solder balls provided on a bottom surface of respective semiconductor chip packages to stack and electrically connect the semiconductor chip packages. The solder balls lead to an increase in thickness of the package manufactured by means of a PIP method. Moreover, since a space is needed between the semiconductor chip packages, a thickness of the package increases with an increase in the number of stacked semiconductor chip packages.

In addition, a process becomes complex when semiconductor chip packages having different structures or sizes are stacked by means of a POP method using solder balls. The present invention addresses these and other disadvantages of the conventional art.

SUMMARY

Exemplary embodiments of the present invention are directed to a stacked-type semiconductor device package. In an exemplary embodiment, the stacked-type semiconductor device package may include: a plurality of stacked semiconductor chip packages with joining electrodes exposed on sides of the semiconductor chip packages; and a flexible printed circuit board (flexible PCB) on which the stacked semiconductor chip packages are mounted, the flexible PCB including a first surface having connecting electrodes corresponding to the joining electrodes of the stacked semiconductor chip packages and a second surface opposite the first surface, wherein the flexible PCB covers the sides of the stacked semiconductor chip packages and the connecting electrodes of the first surface are connected to the joining electrodes of the stacked semiconductor chip packages.

DETAILED DESCRIPTION

The present invention will now be described more fully hereinafter with reference to the accompanying drawings, in which preferred embodiments of the invention are shown.

Figure 1A:
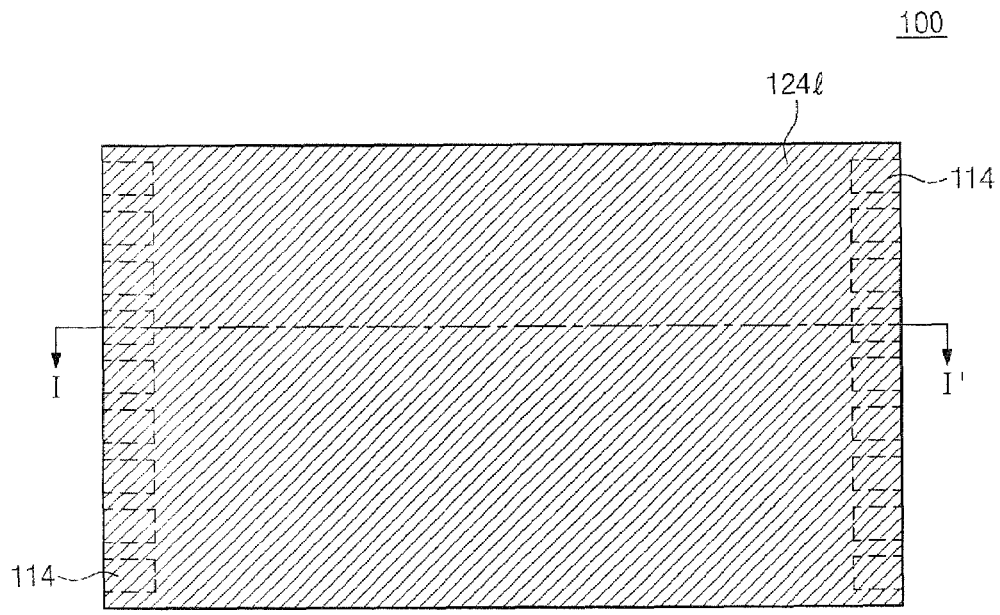
FIG. 1A is a top plan view illustrating a semiconductor chip package according to an embodiment of the present invention.
Figure 1B:
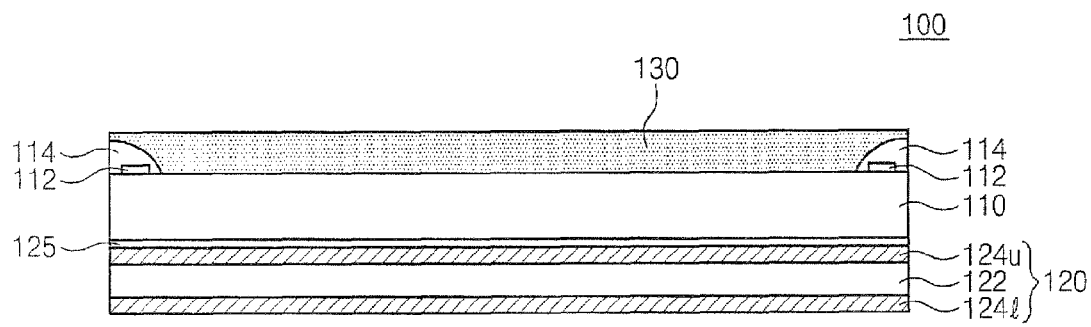
FIG. 1B is a cross-sectional view taken along the line I-I' of FIG. 1A.

FIG. 1A is a top plan view illustrating a semiconductor chip package according to an embodiment of the present invention, and FIG. 1B is a cross-sectional view taken along the line I-I' of FIG. 1A.

Referring to FIGS. 1A and 1B, a semiconductor chip package 100 may include a semiconductor chip 110, a printed circuit board (PCB) 120, and a molding material 130.

The semiconductor chip 110 may include bonding pads 112 and sector-form molding electrodes 114 disposed so as to cover the bonding pads 112, respectively. The bonding pads 112 and the molding electrodes 114 are provided on an active surface of the semiconductor chip 110. The molding electrodes 114 may be formed by separating a semiconductor wafer into semiconductor chips 110 after forming a conductive molding material, such as copper (Cu) or gold (Au), so as to cover adjacent bonding pads between bonding pads of adjacent semiconductor chips on the semiconductor wafer. Thus, the molding electrodes 114 may exhibit a sector form having one side surface aligned with the edge of the semiconductor chip 110 while covering the respective bonding pads 112.

The PCB 120 may include a core material 122 functioning as a body, an upper insulating layer 124u, and a lower insulating layer 124l. The PCB 120 may have one selected from the group consisting of a substrate type, a tape type, and a film type. To decrease thickness of the semiconductor chip package 100, the PCB 120 may have a tape type or a film type. The upper insulating layer 124u and the lower insulating layer 124l may be polyimide or photo solder resist (PSR). The upper insulating layer 124u and the lower insulating layer 124l may be a first surface and a second surface of the PCB 120, respectively. The semiconductor chip 110 may be mounted on the first surface of the PCB 120 using an adhesive material 125.

The molding material 130 may seal the semiconductor chip 110 and the molding electrodes 114. The molding material 130 may be epoxy molding compound (EMC). Thus, the semiconductor chip 110 may have the same size as the PCB 120 and have one side surface of each of the molding electrodes 114 exposed in an edge direction of the semiconductor chip 110. As a result, the semiconductor chip package 100 may include joining electrodes formed by the molding electrodes 114 exposed on the side surface. The joining electrodes may directly be connected to another PCB or an external circuit such as a system board. Alternatively, the joining electrodes may indirectly be connected to another PCB or an external circuit such as a system board using a connecting means. The joining electrodes may be used to test the semiconductor chip package 100.

Figure 2A:
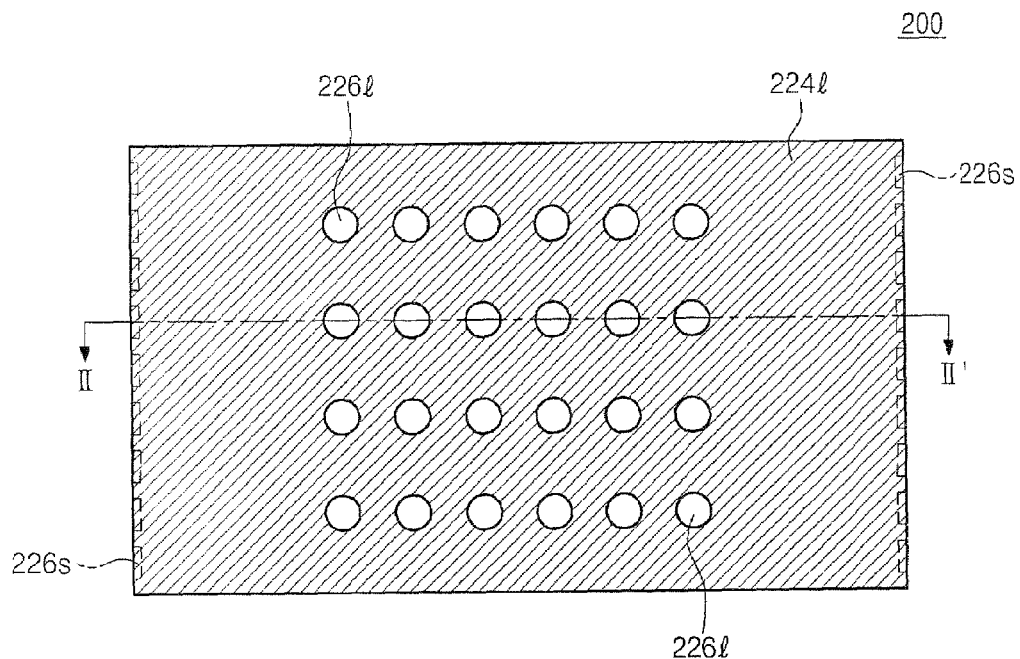
FIG. 2A is a top plan view illustrating a semiconductor chip package according to another embodiment of the present invention.
Figure 2B:
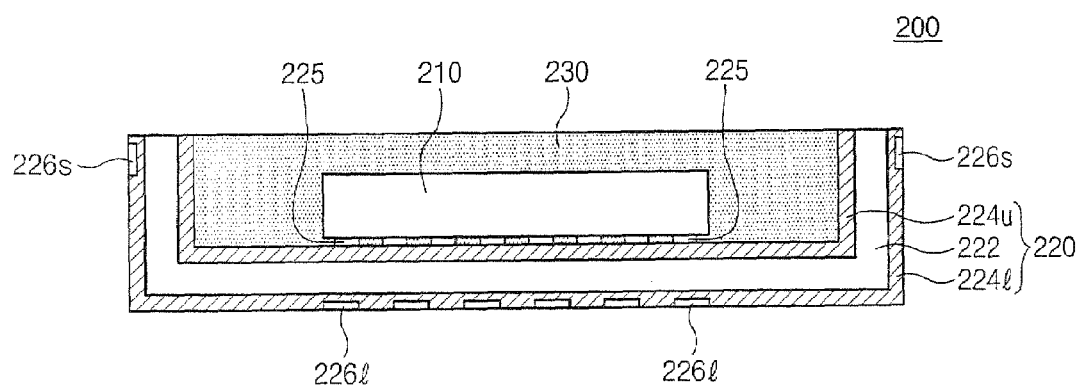
FIG. 2B is a cross-sectional view taken along the line II-II' of FIG. 2A.

FIG. 2A is a top plan view illustrating a semiconductor chip package according to another embodiment of the present invention, and FIG. 2B is a cross-sectional view taken along the line II-II' of FIG. 2A.

Referring to FIGS. 2A and 2B, a semiconductor chip package 200 may include a semiconductor chip 210, a printed circuit board (PCB) 220, and a molding material 230.

The semiconductor chip 210 may include bonding pads (not shown) disposed at an active surface of the semiconductor chip 210. The PCB 220 may include a core material 222 functioning as a body, an upper insulating layer 224u, and a lower insulating layer 224l. The PCB 220 may have a concave internal mounting space. The PCB 220 may have one selected from the group consisting of a substrate type, a tape type, and a film type. To decrease thickness of the semiconductor chip package 200, the PCB 220 may have a tape type or a film type. The upper insulating layer 224u and the lower insulating layer 224l may be polyimide or photo solder resist (PSR). The upper insulating layer 224u and the lower insulating layer 224l may be a first surface and a second surface of the PCB 220, respectively.

The semiconductor chip 210 may be mounted on the first surface of the PCB 220 corresponding to a lower surface of the concave internal mounting space using adhesive means 225. The adhesive means 225 may be a combination of joining lands provided at the bonding pads of the semiconductor chip 210 and the first surface of the PCB 220, respectively. Exposed joining electrodes 226s may be provided at the second surface of the PCB 220 facing away from the concave internal mounting space. The joining electrodes 226s may be connected to an internal wiring (not shown) of the PCB 220. As a result, the semiconductor chip package 200 may include the joining electrodes 226s exposed on the side surface. The joining electrodes 226s may directly be connected to another PCB or an external circuit such as a system board. Alternatively, the joining electrodes 226s may indirectly be connected to another PCB or an external circuit such as a system board using a connecting means. The joining electrodes 226s may be used to test the semiconductor chip package 200.

The molding material 230 may seal the semiconductor chip 210 and the first surface of the PCB 220. The molding material 230 may be epoxy molding compound (EMC). Test lands 226l provided at the second surface of the PCB 220 facing away from the lower surface of the concave internal mounting space may be connected to the internal wiring of the PCB 220 so as to be used to test the semiconductor chip package 200. The test lands 226l may be provided to test the semiconductor chip package 200 using a typical test apparatus including a pogo pin.

Figure 3A:
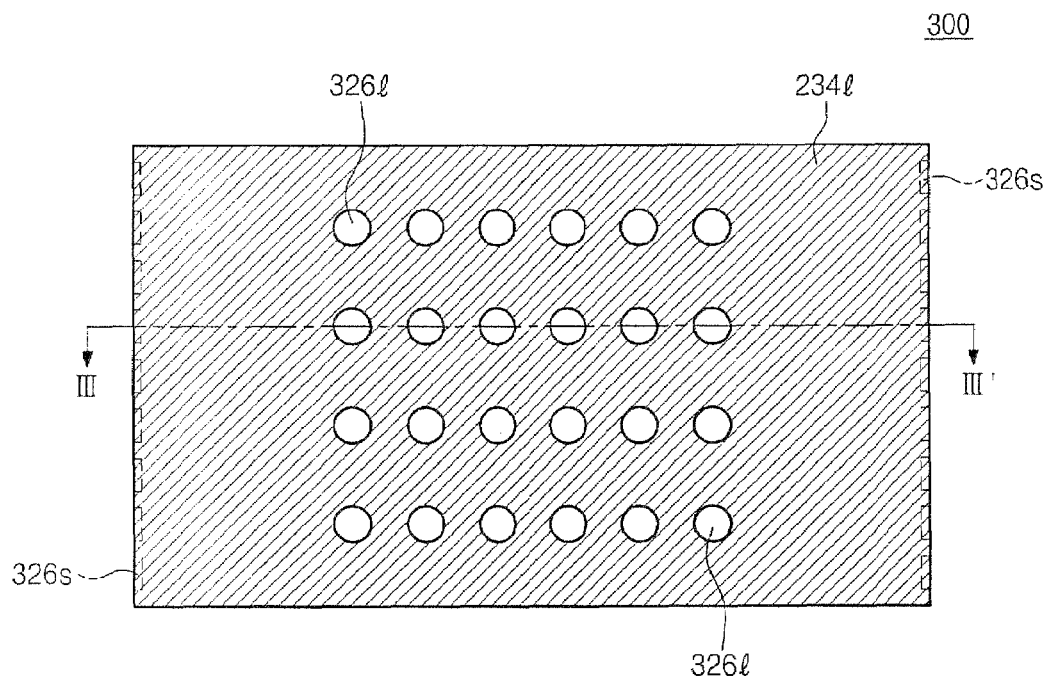
FIG. 3A is a top plan view illustrating a semiconductor chip package according to still another embodiment of the present invention.
Figure 3B:
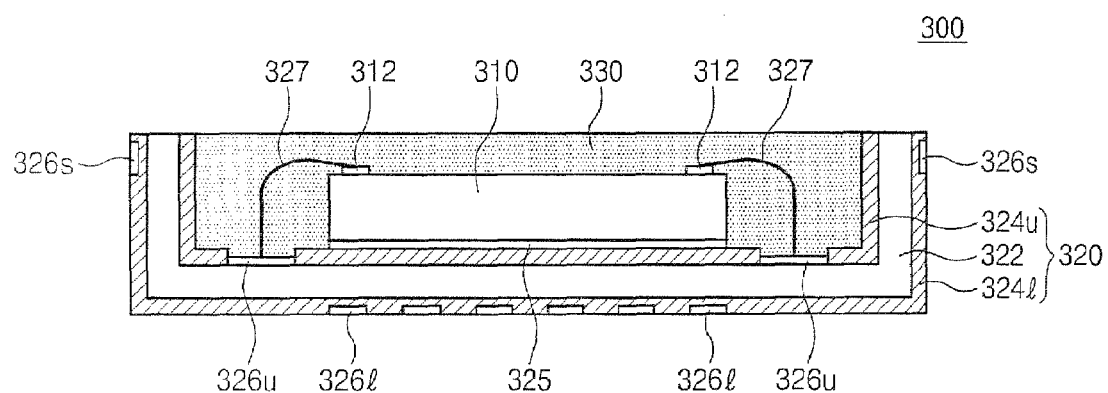
FIG. 3B is a cross-sectional view taken along the line III-III' of FIG. 3A.

FIG. 3A is a top plan view illustrating a semiconductor chip package according to still another embodiment of the present invention, and FIG. 3B is a cross-sectional view taken along the line III-III' of FIG. 3A.

Referring to FIGS. 3A and 3B, a semiconductor chip package 300 may include a semiconductor chip 310, a printed circuit board (PCB) 320, bonding wires 327, and a molding material 330.

The semiconductor chip 310 may include bonding pads 312 disposed at an active surface of the semiconductor chip 310. The PCB 320 may include a core material 322 functioning as a body, an upper insulating layer 324u, and a lower insulating layer 324l. The PCB 320 may have a concave internal mounting space. The PCB 320 may have one selected from the group consisting of a substrate type, a tape type, and a film type. To decrease thickness of the semiconductor chip package 300, the PCB 320 may have a tape type or a film type. The upper insulating layer 324u and the lower insulating layer 324l may be polyimide or photo solder resist (PSR). The upper insulating layer 324u and the lower insulating layer 324l may be a first surface and a second surface of the PCB 320, respectively. The PCB 320 may include bonding electrodes 326u provided at the first surface and each corresponding to respective bonding pads 312.

The semiconductor chip 310 may be mounted on the first surface of the PCB 320 corresponding to a lower surface of the concave internal mounting space using an adhesive material 325. Exposed joining electrodes 326s may be provided at the second surface of the PCB 320 facing away from the concave internal mounting space. The joining electrodes 326s may be connected to an internal wiring (not shown) of the PCB 320. As a result, the semiconductor chip package 300 may include the joining electrodes 326s exposed on the side surface. The joining electrodes 326s may directly be connected to another PCB or an external circuit such as a system board. Alternatively, the joining electrodes 326s may indirectly be connected to another PCB or an external circuit such as a system board using a connecting means. The joining electrodes 326s may be used to test the semiconductor chip package 300.

Bonding wires 327 may electrically connect the bonding pads 312 to corresponding bonding electrodes 326u. The molding material 330 may seal the semiconductor chip 310, the bonding wires 327, and the first surface of the PCB 320. The molding material 330 may be epoxy molding compound (EMC). Test lands 326l provided at the second surface of the PCB 320 facing away from the lower surface of the concave internal mounting space may be connected to internal wiring (not shown) of the PCB 320 so as to be used to test the semiconductor chip package 300. The test lands 326l may be provided to test the semiconductor chip package 300 using a typical test apparatus including a pogo pin.

Since each of the semiconductor chip packages according to the foregoing embodiments is configured to include joining electrodes exposed on a side surface, unlike the conventional art, it is not necessary to provide solder balls for stacking the semiconductor chip packages. Thus, a stacked semiconductor chip package may have decreased thickness.

Figure 4A:
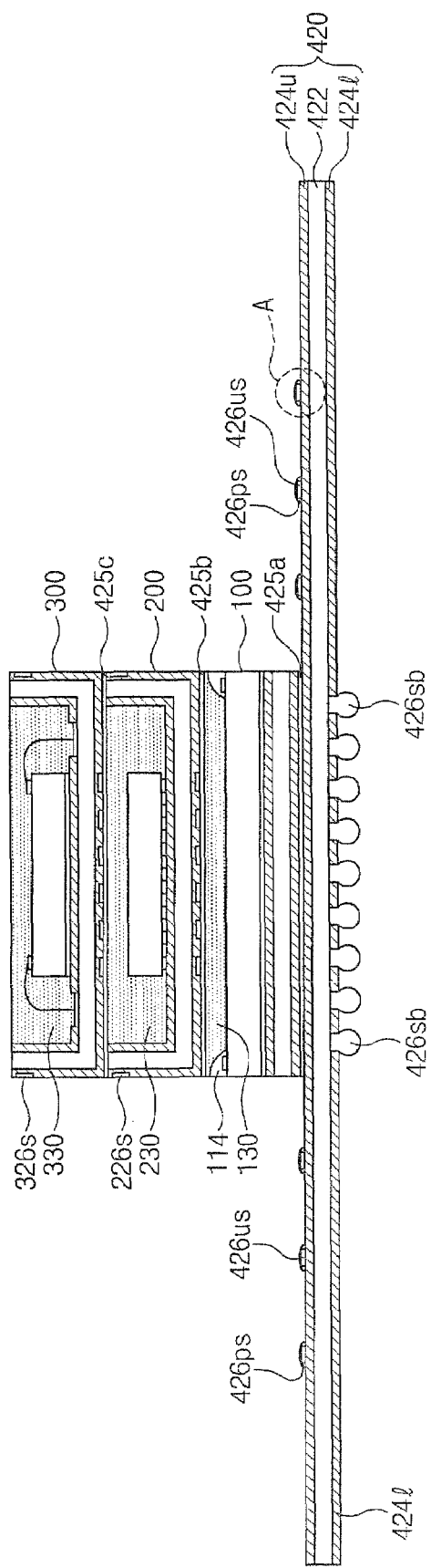
FIGS. 4A through 4C are cross-sectional views illustrating a stacked-type semiconductor device package according to an embodiment of the present invention.
Figure 4B:
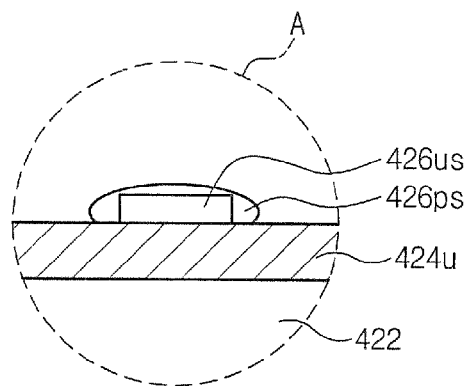
Figure 4C:
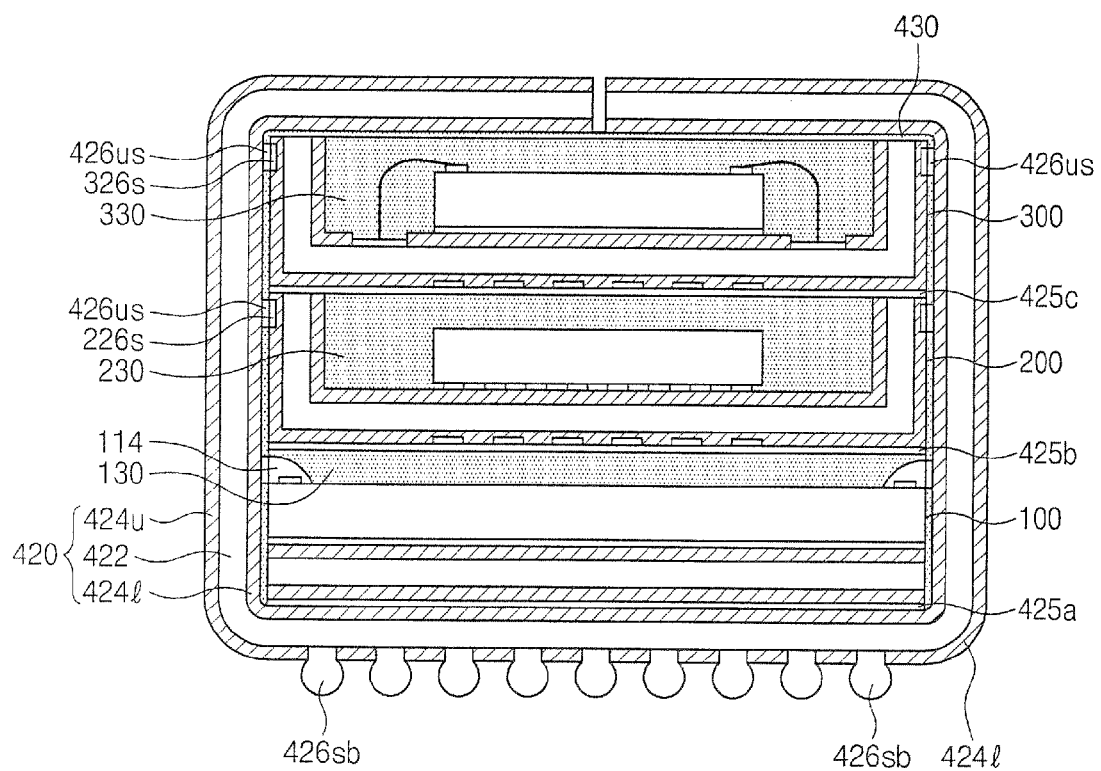

FIGS. 4A through 4C are cross-sectional views illustrating a stacked-type semiconductor device package according to an embodiment of the present invention. The stacked-type semiconductor device package may include stacked semiconductor chip packages 100, 200, and 300, a flexible printed circuit board (flexible PCB) 420, and a molding material 430.

Inter-package adhesive materials 425b and 425c may be provided between the semiconductor chip packages 100 and 200, and the semiconductor chip packages 200 and 300, respectively. The inter-package adhesive materials may be used to adhere the semiconductor chip packages 100 and 200 to each other, and adhere the semiconductor chip packages 200 and 300 to each other, respectively. The stacked semiconductor chip packages 100, 200, and 300 may be mounted on a first surface of the flexible PCB 420, where an upper insulating layer 424u is provided, using an adhesive material 425a. The stacked semiconductor chip packages 100, 200, and 300 may have the same structure and size or different structures and sizes.

The flexible PCB 420 may include a flexible core material 422 functioning as a body, the upper insulating layer 424u, and a lower insulating layer 424l. The upper insulating layer 424u may include connecting electrodes 426us corresponding to joining electrodes 114, 226s, and 326s exposed on side surfaces of the stacked semiconductor chip packages 100, 200, and 300, respectively. The core material 422 may be polyimide including an internal wiring (not shown). The upper insulating layer 424u and the lower insulating layer 424l may be polyimide or photo solder resist (PSR). In the case where the upper insulating layer 424u and the lower insulating layer 424l are polyimide, the flexible PCB 420 may have a tape type or a film type. The upper insulating layer 424u and the lower insulating layer 424l may be a first surface and a second surface of the flexible PCB 420, respectively.

Because the flexible PCB 420 has excellent flexibility, the flexible PCB 420 may cover sides of the stacked semiconductor chip packages 100, 200, and 300. If the flexible PCB 420 has a sufficient length, it may cover an upper portion of the stacked semiconductor chip packages 100, 200, and 300. Thus, the connecting electrodes 426us on the first surface of the PCB 420 may be connected to the joining electrodes 114, 226s, and 326s of the stacked semiconductor chip packages 100, 200, and 300. Referring to a reference numeral "A" of FIG. 4A and FIG. 4B, the connecting electrodes 426us may further include pre-solders 426ps provided on their surfaces to enhance mechanical and electrical reliability between the joining electrodes 114, 226s, and 236s and the connecting electrodes 426us. Each of the pre-solders 426ps may include tin-silver alloy (Sn—Ag alloy).

Unlike what is shown in FIG. 4C, even if the semiconductor chip packages 100, 200, and 300 having different structures and sizes are stacked, the flexible PCB 420 may cover not only sides but also the upper portion of the stacked semiconductor chip packages 100, 200, and 300.

The molding material 430 may seal the stacked semiconductor chip packages 100, 200, and 300, the joining electrodes 114, 226s, and 326s, and the first surface of the flexible PCB 420. The molding material 430 may include epoxy molding compound (EMC). Solder balls 426sb provided on the second surface of the flexible PCB 430 are connected to an internal wiring of the flexible PCB 430 to be connected to an external circuit such as a system board.

Although the present embodiment has been described as including one of each stacked semiconductor chip package 100, 200, and 300, one of ordinary skill in the art would appreciate that other combinations of stacked semiconductor chip packages are included within the spirit and scope of the invention. For instance, the stacked-type semiconductor device package may have two or more stacked semiconductor chip packages 100 and one stacked semiconductor chip package 200, or any other combination of the stacked semiconductor chip packages 100, 200, and 300.

According to the foregoing stacked-type semiconductor device package, after respective semiconductor chip packages are tested, only good semiconductor chip packages are stacked. Therefore, production yield may increase, unlike a conventional semiconductor device package where a plurality of semiconductor devices (or chips) are assembled in one package. As a result, the cost for a manufacturing process may be reduced.

The stacked-type semiconductor device package is configured such that joining electrodes exposed on sides of stacked semiconductor chip packages and connecting electrodes of a flexible PCB are connected using the flexibility of the flexible PCB. Therefore, the thickness of the stacked semiconductor chip packages is not increased due to solder balls that are used to stack conventional semiconductor chip packages. As a result, a stacked-type semiconductor device package with increased mounting density may be achieved.

Due to the above configuration of the stacked-type semiconductor device package, semiconductor chip packages having different structures and sizes may be stacked so as to have various structures. As a result, a stacked-type semiconductor device package is provided to readily package various semiconductor chip packages.

Although the present invention has been described in connection with the embodiment of the present invention illustrated in the accompanying drawings, it is not limited thereto. It will be apparent to those skilled in the art that various substitutions, modifications and changes may be made without departing from the scope and spirit of the invention.

What is claimed is:

1. A stacked-type semiconductor device package, comprising:
    a plurality of stacked semiconductor chip packages with joining electrodes exposed on sides of the semiconductor chip packages; and
    a flexible printed circuit board (PCB) on which the stacked semiconductor chip packages are mounted, the flexible PCB including a first surface having connecting electrodes corresponding to the joining electrodes of the stacked semiconductor chip packages and a second surface opposite the first surface,
    wherein the flexible PCB covers the sides of the stacked semiconductor chip packages, and the connecting electrodes of the first surface are connected to the joining electrodes of the stacked semiconductor chip packages, wherein the stacked semiconductor chip packages have different structures and sizes with respect to each other, and wherein at least one of the stacked semiconductor chip packages comprises:
  a semiconductor chip with bonding pads;
  sector-type joining electrodes disposed to cover the bonding pads;
  a printed circuit board (PCB) including a first surface on which the semiconductor chip is mounted and a second surface opposite the first surface of the PCB; and
  a molding material configured to seal the semiconductor chip and the joining electrodes,
  wherein the semiconductor chip has the same size as the PCB, and one side surface of each of the joining electrodes is exposed.

2. The stacked-type semiconductor device package of claim 1, wherein the semiconductor chip package further comprises:
  an adhesive material disposed between the semiconductor chip and the first surface of the PCB.

3. The stacked-type semiconductor device package of claim 1, wherein the PCB has one selected from the group consisting of a substrate type, a tape type, and a film type.

4. The stacked-type semiconductor device package of claim 1, wherein the molding material includes epoxy molding compound.

5. The stacked-type semiconductor device package of claim 1, wherein the flexible PCB has a tape type or a film type.

6. The stacked-type semiconductor device package of claim 1, further comprising:
  a molding material configured to seal the stacked semiconductor chip packages, the joining electrodes, and the first surface of the flexible PCB.

7. The stacked-type semiconductor device package of claim 6, wherein the molding material includes epoxy molding compound.

8. The stacked-type semiconductor device package of claim 1, further comprising:
  solder balls disposed on the second surface of the flexible PCB.

9. The stacked-type semiconductor device package of claim 1, further comprising pre-solders disposed on the connecting electrodes.

10. The stacked-type semiconductor device package of claim 1, wherein the flexible PCB covers at least a portion of a top surface of at least one of the stacked semiconductor chip packages.

11. The stacked-type semiconductor device package of claim 1, further comprising:
  a first adhesive material adhering a first one of the stacked semiconductor chip packages to the first surface of the flexible PCB; and
  a second adhesive material adhering the plurality of stacked semiconductor chip packages to each other.

12. A stacked-type semiconductor device package, comprising:
  a plurality of stacked semiconductor chip packages with joining electrodes exposed on sides of the semiconductor chip packages; and
  a flexible printed circuit board (PCB) on which the stacked semiconductor chip packages are mounted, the flexible PCB including a first surface having connecting electrodes corresponding to the joining electrodes of the stacked semiconductor chip packages and a second surface opposite the first surface, wherein the flexible PCB covers the sides of the stacked semiconductor chip packages, and the connecting electrodes of the first surface are connected to the joining electrodes of the stacked semiconductor chip packages, wherein the stacked semiconductor chip packages have different structures and sizes with respect to each other, and wherein at least one of the semiconductor chip packages comprises:
  a semiconductor chip with bonding pads;
  a printed circuit board (PCB) comprising a concave internal mounting space, the PCB including a first surface connected to the bonding pads of the semiconductor chip and a second surface opposite the first surface of the PCB; and
  a molding material configured to seal the semiconductor chip and the first surface of the PCB,
  wherein the PCB further includes joining electrodes exposed on both side surfaces of the second surface of the PCB and electrically connected to the bonding pads.

13. The stacked-type semiconductor device package of claim 12, wherein the semiconductor chip package further comprises:
  lands disposed on a bottom surface of the second surface of the PCB.

14. The stacked-type semiconductor device package of claim 12, wherein the PCB has one selected from the group consisting of a substrate type, a tape type, and a film type.

15. The stacked-type semiconductor device package of claim 12, wherein the molding material includes epoxy molding compound.

16. A stacked-type semiconductor device, comprising:
  a plurality of stacked semiconductor chip packages with joining electrodes exposed on sides of the semiconductor chip packages; and
  a flexible printed circuit board (PCB) on which the stacked semiconductor chip packages are mounted, the flexible PCB including a first surface having connecting electrodes corresponding to the joining electrodes of the stacked semiconductor chip packages and a second surface opposite the first surface, wherein the flexible PCB covers the sides of the stacked semiconductor chip packages, and the connecting electrodes of the first surface are connected to the joining electrodes of the stacked semiconductor chip packages, wherein the stacked semiconductor chin packages have different structures and sizes with respect to each other, and wherein at least one of the stacked semiconductor chip packages comprises:
  a semiconductor chip with bonding pads;
  a printed circuit board (PCB) comprising a concave internal mounting space, the PCB including a first surface, on which the semiconductor chip is mounted, having bonding electrodes corresponding to the bonding pads and a second surface opposite the first surface of the PCB;
  bonding wires configured to connect the bonding pads to the bonding electrodes; and a molding material configured to seal the semiconductor chip, the bonding wires, and the first surface of the PCB, wherein the PCB further includes joining electrodes exposed on both side surfaces of the second surface of the PCB and electrically connected to the bonding electrodes.

17. The stacked-type semiconductor device package of claim 16, wherein the semiconductor chip package further comprises:

lands disposed on a bottom surface of the second surface of the PCB.

18. The stacked-type semiconductor device package of claim 16, wherein the PCB has one selected from the group consisting of a substrate type, a tape type, and a film type.

19. The stacked-type semiconductor device package of claim 16, wherein the molding material includes epoxy molding compound.

* * * * *

UNITED STATES PATENT AND TRADEMARK OFFICE
CERTIFICATE OF CORRECTION

| | | |
|---|---|---|
| PATENT NO. | : 7,615,858 B2 | Page 1 of 1 |
| APPLICATION NO. | : 11/961747 | |
| DATED | : November 10, 2009 | |
| INVENTOR(S) | : Eun | |

It is certified that error appears in the above-identified patent and that said Letters Patent is hereby corrected as shown below:

Column 8, line 53, the word "chin" should read -- chip --.

Signed and Sealed this

Sixteenth Day of March, 2010

David J. Kappos
*Director of the United States Patent and Trademark Office*